United States Patent [19]

Schmidt et al.

[11] Patent Number: 5,254,209
[45] Date of Patent: Oct. 19, 1993

[54] METHOD OF MAKING MICROMECHANICAL COMPONENTS

[75] Inventors: Steffen Schmidt; Hans-Peter Trah, both of Reutlingen; Franz Riedinger, Burladingen, all of Fed. Rep. of Germany

[73] Assignee: Robert Bosch GmbH, Stuttgart, Fed. Rep. of Germany

[21] Appl. No.: 960,817

[22] Filed: Oct. 8, 1992

[30] Foreign Application Priority Data

Oct. 17, 1991 [DE] Fed. Rep. of Germany ....... 4134291

[51] Int. Cl.⁵ .................... H01L 21/306; B44C 1/22; C03C 15/00; C03C 25/06
[52] U.S. Cl. .................... 156/626; 156/645; 156/647; 156/657; 156/659.1; 156/662
[58] Field of Search ............. 156/626, 645, 647, 657, 156/659.1, 661.1, 662; 430/313, 314

[56] References Cited

U.S. PATENT DOCUMENTS

| 4,374,915 | 2/1983 | Ahlquist et al. ............ 156/644 X |
| 4,470,875 | 9/1984 | Poteat .................. 156/644 |
| 5,142,781 | 9/1992 | Mettner et al. ........... 29/890.124 |
| 5,148,604 | 9/1992 | Bantien .................. 33/366 |

FOREIGN PATENT DOCUMENTS

206450 1/1984 Fed. Rep. of Germany.

OTHER PUBLICATIONS

Fossum, Limitation of Orientation Dependent Microstructure Etching in Silicon, J. Electochem. Soc.: Solid-State Science and Techn., vol. 134, No. 12, Dec. 1987, pp. 3192-3194.

Kendall, On Etching Very Narrow Grooves in Silicon, Applied Phys. Letters vol. 26, No. 4, Feb. 15, 1975, pp. 195-198.

Silicon Wafer Technology-State of the Art 1976, Herring, Solid State Technology, May 1976, vol. 19, No. 5, pp. 37-42.

Poteat, Submicron Accuracies in Anisotropic Etched Silicon Piece Parts-A Case Study, Micromachining and Micropackaging of Transducers, 1985, pp. 151-158.

Anonymous, Research Disclosure, "Alignment Marker on (100) Silicon," Oct. 1991, disclosure No. 33005, p. 718.

*Primary Examiner*—William A. Powell
*Attorney, Agent, or Firm*—Frishauf, Holtz, Goodman & Woodward

[57] ABSTRACT

A method of making micromechanical structures from silicon involves cutting a monocrystalline silicon wafer. The orientation of the crystal structure relative to the flat of the wafer is first determined, and this information is taken into account in the subsequent structuring steps.

11 Claims, 2 Drawing Sheets

METHOD OF MAKING MICROMECHANICAL COMPONENTS

Cross-reference to commonly owned patents, the disclosures of which are hereby incorporated by reference:

U.S. Pat. No. 4,955,234, MAREK, issued Sept. 11, 1990=DE 38 14 952;

U.S. Pat. No. 5,071,510 FINDLER 7 MUENZEL, issued Dec. 10, 1991, corresponding to German P 39 31 590.0 of Sept. 22, 1989 and German application P 40 02 472.0 of Feb. 6, 1990, U.S. Pat. No. 5,148,604, BANTIEN, issued Sept. 22, 1992;

U.S. Pat. No. 5,142,781, METTNER et al., issued Sept. 1, 1992; and corresponding PCT/EP90/01297, publ. as WO 91-02169.

CROSS-REFERENCE TO OTHER PATENT

German Dem. Rep. Patent 206,450, issued Jan. 25, 1984, WESTPHAL et al.

FIELD OF THE INVENTION

This invention relates to a method of making micromechanical components and, more particularly, to a method of making silicon micromechanical components, by anisotropically etching of silicon wafers, whereby the component is aligned relative to the crystal structure of the silicon.

BACKGROUND OF THE INVENTION

It is known to make micromechanical components by anisotropically etching a silicon wafer, whereby the micromechanical components must be aligned relative to the orientation of the silicon wafer crystals. The alignment relative to the crystal structure is accomplished by means of a flattened side, the so-called flat, of the otherwise circular wafer, the flat being normally provided by the manufacturer at an angular precision of one degree. This angular precision of one degree is sufficient for the manufacture of most electronic components made from silicon. Wafers with an angular precision of the flat better than one degree are available at a higher price.

THE INVENTION

By comparison, the method in accordance with the invention is advantageous in that it allows making a very high angular precision alignment of micromechanical structures relative to their crystal structure, in an economical manner.

The method of making micromechanical components by anisotropically etching silicon wafers, with the component being aligned relative to the crystal structure of the silicon, advantageously includes determining the crystal structure relative to the flat of one wafer, taken from a plurality of wafers cut from a single silicon crystal rod and utilizing the data for aligning the structures in the structuring of the remaining wafers.

In another advantageous embodiment of the invention, an aperture of rectangular configuration is etched into the wafer for the purpose of determining its crystal structure relative to the flat, and a measurement is taken of the portion etched out under the etching mask.

In yet another advantageous embodiment, the structures are obtained by exposure through masks, and adjustment or alignment markers are made with the first mask to be exposed on all further masks, and the first mask allows an adjustment relative to the In another advantageous embodiment, the first mask is provided with two adjustment markers spaced at the distance of half the length of the flat.

A further advantage of the method in accordance with the invention is derived from adjustment markers being provided with beams, the distance between which is a function of the desired angular precision and the distance between the adjustment structures.

DRAWINGS

Embodiments of the invention are depicted in the drawings and are explained in detail in the following description. In the drawings, FIG. 1 depicts an etched cavity in silicon 100;

DETAILED DESCRIPTION

Figure 1:
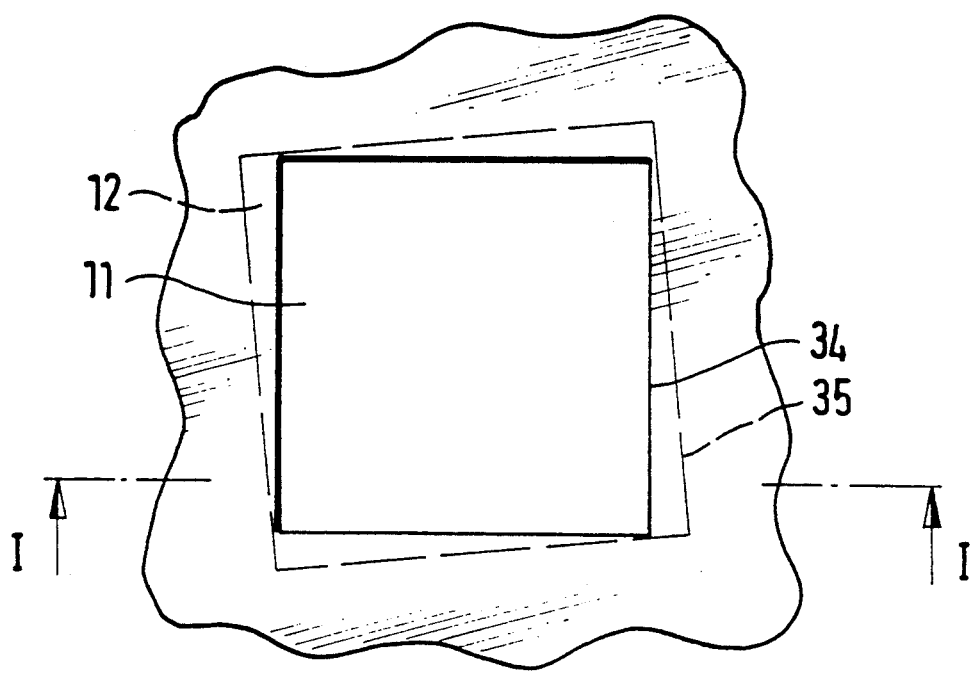
Figure 2:
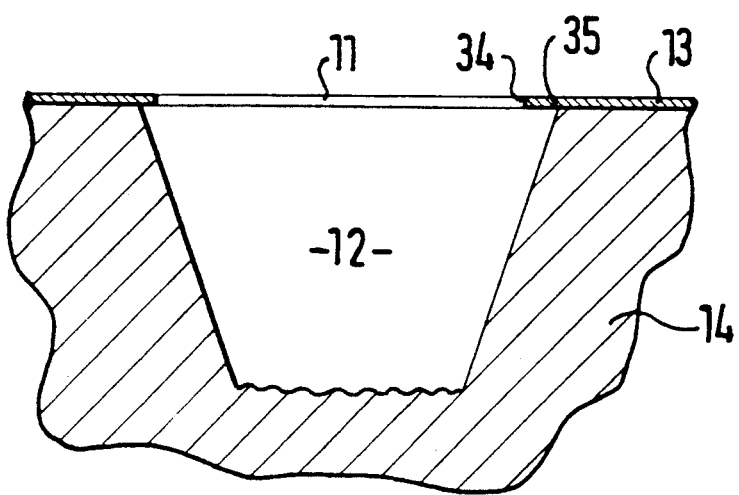
FIG. 2 depicts a cross-section through the structure of FIG. 1.

In FIG. 1 and FIG. 2, there is shown a cavity etched into 100 oriented silicon. FIG. 1 is a planar view, FIG. 2 shows a cross-section through FIG. 1 along line I—I. 11 is a square opening in a silicon nitride layer 13, and 12 is the finished etched cavity which has partially under-etched the etching mask 13. 14 represents the silicon wafer oriented in direction 100.

The method in accordance with the invention is also suited for etching 110-type wafers. A person skilled in the art is familiar with the corresponding etching geometry in 110-type wafers.

Apertures of a rectangular or, as shown in FIG. 1, square outline may be etched into 100 oriented silicon by means of alkaline etching solutions. The walls of these structures are inclined at an angle of 54.7 degrees relative to the surface, so that the angle of the walls with respect to each other is about 70.5 degrees. For purposes of etching such an aperture into a wafer, the surface is initially covered with a silicon nitride layer to serve as an etching masks. To improve the adhesion of the etching mask to the silicon surface, a thin silicon oxide layer may be precipitated prior to the precipitation of the silicon nitride layer. The silicon nitride layer is then structured to expose wafer surface portions which may then be attacked by the basic or alkaline etching solution, which usually is potassium hydroxide (KOH). It is necessary, however, exactly to align the margins of the rectangular or square etched opening, relative to the crystal structure. An incorrect adjustment of these margins relative to the 111-type surfaces which limit the area affected by the etching, results in an under-etching of the etching mask. This is shown in planar view in FIG. 1. The square etched window or aperture 11 was under-etched so that an etched cavity of an enlarged square outline was produced. The sides of the etched cavity are formed by the 111-type surfaces of the silicon wafer which limit the area in which the etching is effective.

As shown in FIG. 2, this resulted in the etching mask 13 being under-etched. Because of a faulty alignment of etching window of the silicon nitride layer 13 the geometry of the cavity actually produced deviates from the desired geometry. The angular precision of 0.3 degrees of known flats is, therefore, unsatisfactory for the manufacture of micromechanical structures; a higher angular precision of, for example, 0.05 degrees is to be aimed at.

The method in accordance with the invention makes use of the fact that silicon wafers are made in large quantities from a unitary silicon crystal rod. For the manufacture of silicon wafers a large rod-shaped unitary silicon crystal is first made. This crystal rod is then shaped into a configuration of circular cross-section. Thereafter, one side of the entire crystal is ground off to form the flat. Only then is the rod-shaped crystal divided into individual wafer discs. Consequently, the reproducibility of the angular fault of wafers made from one lot or charge, that is to say, wafers cut from a single silicon crystal rod is significantly improved, even though the alignment of the flat is precise to about 0.3 degrees only. Differences in the orientation of the flats will occur only as a result of rounding off the margins of the wafer. It has, however, been found that this rounding off is quite reproducible, so that the angle orientation of the flat of all wafers from one lot or charge, i.e., wafers made from a single crystal rod, is identical.

The method in accordance with the invention makes use of this finding, in that the angular deviation in a test wafer taken from a lot is measured, and the information is then used for aligning the structures on the remaining wafers of that lot. The angular orientation of the flat may be defined, for instance, by taking the measurement of a structure of the kind shown in FIG. 1.

The angular orientation is depicted by the margin of the etched window 34 and by the margin of the etched cavity 35. The margin of the etched window has been produced on the wafer in such a manner that it extends in parallel to the flat. The angle between the margins 34 and 35 corresponds to the angle between the flat and the 111 direction. It is of advantage that in planar view, as seen through a microscope, the under-etched portion of the silicon nitride mask 13 is of a color different from the color of the surface which is not under-etched. The angular orientation may be established from measurements taken under a microscope and by simple trigonometric calculations.

Figure 3:
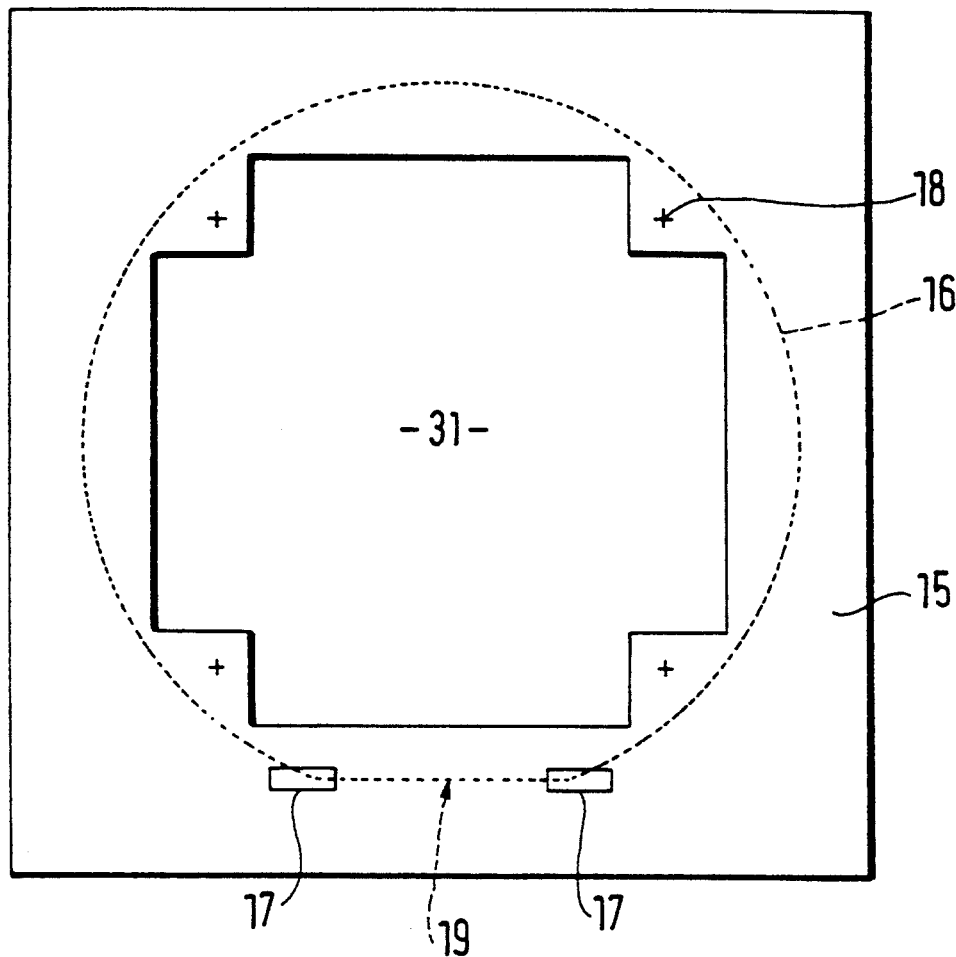
FIG. 3 depicts the arrangement of the adjustment structures on the mask.

The mask 15 shown in FIG. 3 makes use of the method in accordance with the invention. On the mask 15 there are provided cross-shaped alignment or calibration indicia 18 and angle adjustment structures 17. The actual structures of the micromechanical components are only schematically depicted by the surface area 31. The mask 15 serves to structure the silicon nitride layer 13. The structure of such a mask 15 from glass and chromium, and the corresponding photolithography and etching processes for the structuring of the masking 13 are familiar to persons skilled in the art. The outline of a silicon wafer 16 with its flat 19 positioned under the mask 15 is shown schematically.

The alignment crosses 18 are transferred to the wafer 16 by photo lithography and by etching processes, and serve to align any other masks required for the processing of the wafer 16. The mask 15 is adjusted relative to the flat 19 of the wafer 16 by means of the angle adjustment structures 17. For this purpose, the data about the exact angle previously obtained from another wafer of the same lot is drawn upon for precisely aligning the mask 15 relative to the crystal structure of the wafer 16.

Figure 4:
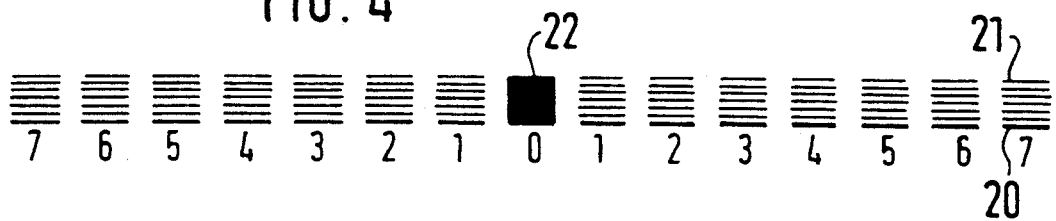
FIG. 4 depicts the adjustment structures.

Details of the structure of the angle adjustment structures 17 are shown in FIG. 4; at this point it is only important to note that they make possible an alignment relative to the flat. For adjusting the mask 15 relative to the flat 19, a microscope equipped with two lenses is used, one each being positioned over an angle adjustment structure 17. The image of the two angle adjustment structures 17 is projected on a common plane and thus permits an observer simultaneously to adjust both structures. The arrangement of the angle adjustment structures relative to the structures of the micromechanical components 31 is selected in such a manner that the structures 31 are positioned in the center of the wafer. If an imaginary line is drawn from one angle adjustment structure 17 to another and a line extending vertically thereof is drawn through a point midway between both angle adjustment structures 17, the line will be seen to have a length of about 47.3 mm to the center of the area 31 in which the structures are to be placed. These dimensions hold true for micromechanical components made from wafers having a diameter of 100 mm.

FIG. 4 depicts an angle adjustment structure 17. It consist of a center block 22 and beams 20 and 21 placed on the mask 15. The center block 22 and the beams 20 and 21 appear on the mask 15 as light impervious areas. The distance between the two center blocks 22 of the two angle adjustment structures 17 on the mask is exactly 32.5 mm. This corresponds to the average length of flats in wafers having a diameter of 100 mm. The desired length of the flat may deviate by 2.5 mm in either direction. To the left and to the right of the center block 22 of each angle adjustment structure 17, the beams are arranged in seven groups of seven beams each.

The lower beam 20, the so-called zero beam, measures 10 by 200 micrometers, the other six beams each measure 6 by 200 micrometers. Between the individual groups of beams there is a void measuring 100 micrometers. The spacing between the beams in a group measures, from the center line of the beam, 28.36 micrometers. At a average flat length of 32.5 mm, the spacing corresponds to an angle of 0.05 degrees. Therefore, if during adjustment one of the angle adjustment structures is maintained in a fixed position relative to the flat, and the other structure is moved by one beam, the angle of the mask relative to the wafer is changed by 0.05 degrees. With six further beams at 0.05 degrees each the total is not more than the maximum angular tolerance of 0.3 degrees. Since on each side of the center block there are provided seven groups of beams, any permissible tolerance of the flat length may thus be compensated. During adjustment the mask is initially moved in such a manner that the points of intersection between the flat 19 and the round portion of the wafer 16 are positioned symmetrically under the two angle adjustment structures, i.e., under the mirror symmetrical groups of beams. One of the angle adjustment structures is then adjusted in such a way that its zero line coincides with the flat 19, at the other angle adjustment structure 17 the beam 21 required for the angle correction is thereafter moved to coincide with the flat. The data about which beam is to be selected for the correction will have previously been determined with a test wafer.

What is claimed is:

1. A method of making micromechanical components from silicon by anisotropically etching silicon wafers in a manner suitable to align the components relative to the crystal structure of the silicon, comprising the steps of:

taking a single wafer from a plurality of substantially identical wafers made from a rod-shaped unitary silicon crystal and provided with a substantially flat portion of predetermined length in their circumference;

deriving a value characteristic of the orientation of the crystal structure of said single wafer relative to said flat portion; and applying said value to the remaining wafers of said plurality for the processing thereof.

2. The method of claim 1, wherein said deriving step further includes:

placing a mask on a surface of said single wafer, whereby a substantially rectangular area of said surface is exposed with one margin of aid area extending substantially in parallel to said flat portion of said single wafer;

etching a cavity into said surface along the margins of said area; and measuring the angular deviation of the edge of at least one wall, of said cavity etched below said mask, relative to the adjacent margin of the area.

3. The method of claim 2, wherein said mask is applied to said surface as a layer of silicon nitride with portions thereof subsequentially removed to expose said area.

4. The method of claim 3, wherein a layer of silicon oxide is provided between said surfaces and said layer of silicon nitride.

5. The method of claim 2, wherein the step of applying said value to said remaining wafers further includes:

sequentially placing an alignment mask provided with first alignment indicia corresponding to said value on said remaining wafers; and adjusting the position of said alignment mask on said wafer by aligning said indicia relative to said flat portion.

6. The method of claim 5, wherein said first alignment indicia comprise first and second marks linearly spaced from each other by a distance substantially equal to the length of said flat portion, and wherein said adjustment step includes:

placing said first and second markers on the ends of said flat portion and rotating at least one of said first and second markers relative to said flat portion into a position corresponding to said angular deviation.

7. The method of claim 6, wherein said first and second markers comprise centering means having on at least one side thereof a plurality of laterally evenly spaced groups of a plurality of vertically arranged lines, said lines corresponding to predetermined increments of said angular deviation, and wherein said adjustment step includes:

aligning said centering means with the ends of said flat portion; and rotating at least one of said first and second markers relative to the flat portion to move one of said lines corresponding to said angular deviation into alignment with said flat portion.

8. The method of claim 7, wherein said step of rotating said at least one marker proceeds from a position in which a predetermined one of said lines in any one of said groups is in alignment with said flat portion.

9. The method of claim 7, wherein said group of lines are spaced from each other by 100 micrometers and wherein rotating said at least one marker in increments of one of said vertically arranged lines corresponds to an angular increment of 0.05 degrees.

10. The method of claim 9, wherein said aligning step is performed under a microscope having first and second objective lenses respectively positioned over said first and second markers.

11. The method of claim 10, wherein said alignment masks is provided with second alignment indicia and said step of applying said value to said remaining wafers includes photomechanically reproducing said second alignment indicia on the surface of said remaining wafers.

* * * * *